(12) United States Patent
Larzul

(10) Patent No.: US 9,547,739 B2
(45) Date of Patent: Jan. 17, 2017

(54) PLACING AND ROUTING DEBUGGING LOGIC

(71) Applicant: Synopsys, Inc., Mountain View, CA (US)

(72) Inventor: Ludovic Marc Larzul, Folsom, CA (US)

(73) Assignee: Synopsys, Inc., Mountain View, CA (US)

( * ) Notice: Subject to any disclaimer, the term of this patent is extended or adjusted under 35 U.S.C. 154(b) by 10 days.

(21) Appl. No.: 14/715,428

(22) Filed: May 18, 2015

(65) Prior Publication Data

US 2016/0342721 A1    Nov. 24, 2016

(51) Int. Cl.
*G06F 17/50* (2006.01)
*G06F 11/22* (2006.01)

(52) U.S. Cl.
CPC ....... *G06F 17/5054* (2013.01); *G06F 17/5072* (2013.01); *G06F 17/5077* (2013.01)

(58) Field of Classification Search
CPC .................................................. G06F 17/5036
USPC ........................................................ 716/136
See application file for complete search history.

(56) References Cited

U.S. PATENT DOCUMENTS

| | | | | |
|---|---|---|---|---|
| 5,684,721 A | * | 11/1997 | Swoboda | G01R 31/31853 703/23 |
| 7,072,825 B2 | | 7/2006 | Wang et al. | |
| 7,366,652 B2 | | 4/2008 | Wang et al. | |
| 2002/0065646 A1 | * | 5/2002 | Waldie | G06F 11/3644 703/26 |
| 2003/0131325 A1 | * | 7/2003 | Schubert | G06F 17/5022 716/106 |
| 2008/0270951 A1 | * | 10/2008 | Anand | H01L 22/34 716/136 |
| 2009/0083690 A1 | * | 3/2009 | Habib | G06F 17/5072 716/104 |
| 2009/0204933 A1 | * | 8/2009 | Rezgui | H03K 19/0033 716/122 |
| 2014/0032204 A1 | | 1/2014 | Suresh et al. | |
| 2016/0098504 A1 | | 4/2016 | Larzul et al. | |

* cited by examiner

*Primary Examiner* — Suresh Memula
(74) *Attorney, Agent, or Firm* — Fenwick & West LLP

(57) ABSTRACT

Embodiments relate an emulation environment that places debugging logic in a manner that connections between the debugging logic and logic components outputs can be efficiently routed. In one embodiment, the host system places the debugging logic after placing the logic components of the DUT, but before routing the logic components. In another embodiment, the host system places debugging logic after placing and routing logic components of the DUT. In another embodiment, for one or more emulator FPGAs, the host system places debugging logic units of the debugging logic evenly across the FPGA before placing logic components of the DUT.

19 Claims, 7 Drawing Sheets

PLACING AND ROUTING DEBUGGING LOGIC

BACKGROUND

1. Field of Art

The disclosure generally relates to the emulation of circuits, and more specifically to placing and routing of debugging logic in an emulated circuit.

2. Description of the Related Art

Configurable hardware design tools, such as emulators and other field programmable gate array (FPGA) prototypes have been developed to assist circuit designers in designing and debugging highly complex integrated circuits. For example, an emulator includes multiple reconfigurable components, such as FPGAs that together can imitate the operations of a design under test (DUT). By using a design tool to imitate the operations of a DUT, designers can verify whether a DUT complies with various design requirements prior to fabrication.

An aspect of imitating the operations of a DUT includes incorporating debugging logic with the DUT. Debugging logic is a circuit or a hardware component that traces signals or outputs of logic components (e.g., a register, logic gate, memory, and etc.) of the DUT. For example, debugging logic may track a number of toggles in a logic component output or track whether a logic component output has transitioned to a certain state. The information gathered by debugging logic can be used, for example, to verify the functionality of the DUT or to determine certain properties of the DUT (e.g., DUT's power consumption).

When debugging logic is placed, for example, on an FPGA that is emulating components of the DUT, outputs of DUT logic components to be traced are electrically coupled or routed to the debugging logic through a routing layer in order for the debugging logic to trace the target outputs. However, placements of debugging logic may not be optimized and contribute to inefficient routings between the logic components and the debugging logic. This can result in FPGAs that do not compile, or forcing FPGA designers to overload FPGAs with routing resources dedicated to debug or shared between the design and the debug.

Therefore, a conventional emulation environment is inefficient in terms of placing debugging logic and routing the debugging logic to logic components of a DUT.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

Figure 1:
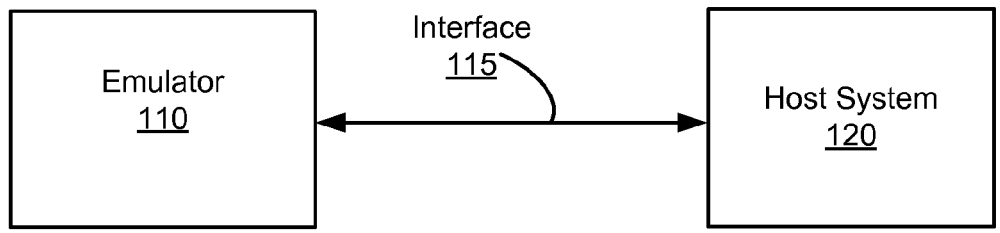
FIG. 1 is a block diagram of an emulation environment, according to one embodiment.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. The figures depict embodiments of the disclosed system (or method) for purposes of illustration only. It should be recognized from the following description that alternative embodiments of the structures and methods illustrated herein may be employed without departing from the principles described herein.

The figures use like reference numerals to identify like elements. A letter after a reference numeral, such as "102A," indicates that the text refers specifically to the element having that particular reference numeral. A reference numeral in the text without a following letter, such as "120," refers to any or all of the elements in the figures bearing that reference numeral.

Configuration Overview

A disclosed system (and method and computer program product) includes an emulation environment that places debugging logic in a manner that connections between the debugging logic and logic components outputs can be efficiently routed.

One embodiment of the emulation environment includes a host system and an emulator. For a DUT that is to be emulated, the host system determines the placement of DUT logic components and debugging logic on field-programmable gate arrays (FPGAs) of the emulator. The host also determines the routing of connections between placed components. The host system configures the emulator to emulate the DUT along with the debugging logic according to the determined placement and routing. During emulation, the debugging logic traces outputs of DUT logic components to obtain certain information about the DUT (e.g., a number of toggles).

In one embodiment, the host system places the debugging logic after placing the logic components of the DUT, but before routing the logic components. Based on the placement of the DUT logic components, the host system places one or more debugging logic units (herein also referred to as "debug logic units"), each near DUT components. Once the logic components and the debugging logic have been placed, the host system determines routing between the logic components and routing between the logic components and the debugging logic. In this embodiment, the routing between the debugging logic and the logic components is prioritized over routing between the logic components. As a result of placing the debugging logic near the logic components and prior to any routing, the routes between the debugging logic and the logic components will be small in distance.

In another embodiment, the host system places debugging logic after placing and routing logic components of the DUT. Based on the placement and routing of the logic components, the host system places one or more debugging logic units, each placed as close as possible to the logic components. In this embodiment, routing between the logic components is prioritized over routing between debugging logic and logic components. By placing the debugging logic after the placing and routing of the logic components, the routing between the logic components does not have to be modified based on debugging logic.

In another embodiment, for one or more emulator FPGAs, the host system places debugging logic units evenly across the FPGA before placing logic components of the DUT. The host system distributes multiple debugging logic units evenly across an emulator FPGA such that any logic components placed afterwards can be routed to at least one debugging logic unit within a predetermined distance.

A logic component herein refers to any circuit component (e.g., register, a logic gate, a transistor, memory, and etc.) of a DUT.

An act of placing logic (e.g., logic components or debugging logic) refers to determining one or more locations for logic to be placed on a configurable hardware component (e.g., FPGA) of an emulator.

An act of routing logic refers to determining connections between placed logic on configurable hardware component (e.g., FPGA) of an emulator.

Debugging logic herein refers to a system or circuit implemented that does not belong to the original design and can be connected to signals of the design, for example, to understand the behavior of the design (e.g., verify the operation of the design). In one example, debugging logic includes one or more circuits used to trace one or more signal values of logic components of a DUT. In another example, debugging logic includes System Verilog Assertions, assertions, monitors, checkers, triggers, actors, etc.

Example Emulation Environment

Figure (FIG. 1 is a block diagram illustrating an emulation environment 100, according to one embodiment. The emulation environment 100 includes an emulator 110 and a host system 120. The emulator 110 and the host system 120 communicate through an interface 115.

The interface 115 is a communication medium that allows communication between the host system 120 and the emulator 110. In one embodiment, the interface 115 is a cable with electrical connections. For example, the interface 115 may be an USB, ETHERNET, optical, or a custom built cable. In other embodiment, the interface 115 is a wireless communication medium or a network. For another example, the interface 115 may be a wireless communication medium employing a Bluetooth® or IEEE 802.11 protocol.

The emulator 110 is a hardware system that emulates DUTs. The emulator 110 includes FPGAs (may also be referred to as "emulation components") that can be configured to collectively emulate a DUT. In other embodiments, the emulator 110 includes other types of reconfigurable hardware components instead of FPGAs. For a DUT that is to be emulated, the emulator 110 receives from the host system 120 a bit stream (e.g., one or more binary files) including a description of a DUT (e.g., a gate level or HDL description of the DUT) and a description of debugging logic. Additionally, the bit stream describes partitions of the DUT created by the host system 120, mappings of the partitions to emulator FPGAs, placement of logic (DUT logic and debugging logic) on FPGAs, and routings between placed logic. Based on the bit stream, the emulator 110 configures the appropriate FPGAs and emulates the DUT.

The host system 120 configures the emulator 110 for emulating a design under test (DUT) with debugging logic. A DUT is one or more circuit designs that are to be emulated by the emulator 110. The host system 120 may be a single computer or a collection of multiple computers. In the embodiment where the host system 120 is comprised of multiple computers, the functions described herein as being performed by the host system 120 may be distributed among the multiple computers.

The host system 120 receives from a user a description of a DUT to be implemented on the emulator 110. In one embodiment, the description of the DUT is in a type of hardware description language (HDL), such as register transfer language (RTL). The host system 120 creates a gate level netlist based on the HDL description of the DUT. In another embodiment, the description of the DUT received from the user is in a gate level netlist. The host system 120 uses the netlist to determine placement and routing of DUT logic components on the FPGAs of the emulator 110.

The host system 120 also receives from a description of debugging logic to be implemented on the emulator 110 with the DUT. In one embodiment, the host system 120 receives from a user a list of signals to be observed or a type of debugging logic to be implemented, and the host system 120 creates debugging logic according to the user input. In one embodiment, the host system 120 receives from a user a description of the debugging logic in a gate level netlist or in a type of HDL (e.g., RTL) from which a gate level netlist is created. The host system 120 may receive the description of the debugging logic together with the DUT. In one embodiment, the host system 120 adds the debugging logic at predetermined locations regardless of the DUT. The host system 120 determines the placement and routing of the debugging logic on the emulator FPGAs in a manner that the routings between DUT logic components and the debugging logic can be optimized.

The host system 120 generates one or more bit streams which includes information to configure the emulator FPGAs to emulate the DUT with the debugging logic. A bit stream may include, for example, a design description of one or more partitions of the DUT (e.g., gate level or HDL description), mapping information (e.g., mappings of partitions to FPGAs), placement and routing information, and design constraints for the DUT.

Through interface 115, the host system 120 transmits to the emulator 110 the created bit streams to configure the FPGAs to emulate the DUT. During and/or after the emulator 110 emulates the DUT, the host system 120 receives emulation results from the emulator 110. Emulation results are information generated by the emulator 110 based on the emulation of the DUT.

Figure 2:
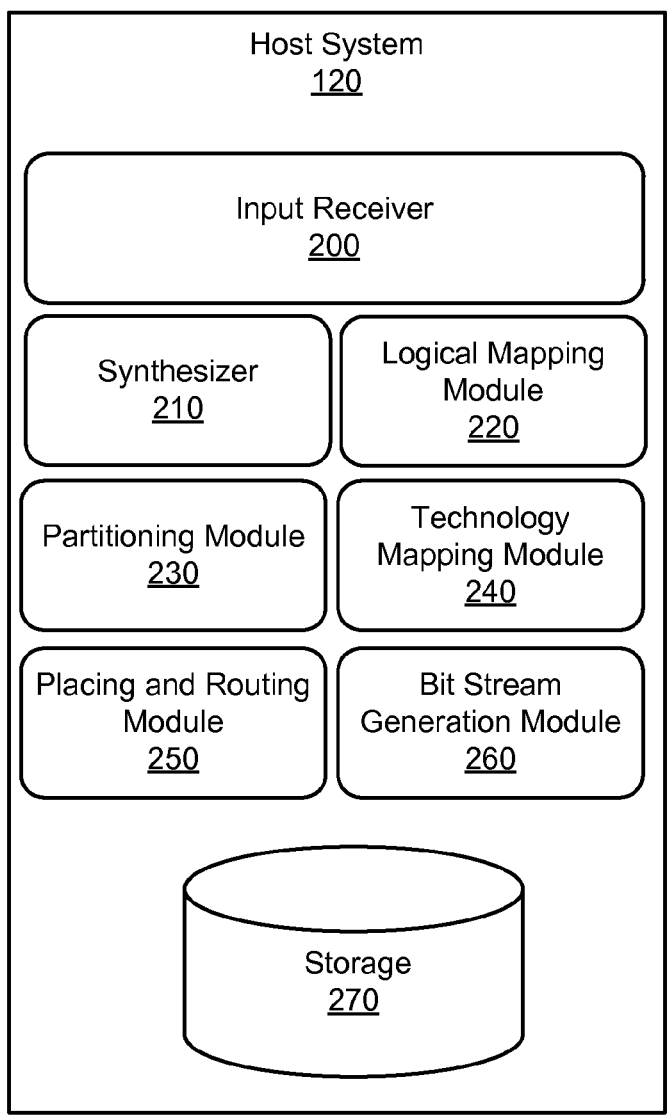
FIG. 2 is a block diagram illustrating a host system, according to one embodiment.

FIG. 2 is a block diagram illustrating the host system 120 in more detail, according to one embodiment. The host system 120 includes an input receiver 200, synthesizer 210, logical mapping module 220, partitioning module 230, technology mapping module 240, placing and routing module 250, bit stream generation module 260, and storage 270. Each of these components may be embodied as hardware, software, firmware, or a combination thereof. Together these components generate information to configure the emulator 110 to emulate a DUT.

The input receiver 200 receives descriptions of a DUT and debugging logic to be implemented by the emulator 110. In one embodiment, the input receiver 200 receives the descriptions of the DUT and the debugging logic in HDL description or in a gate level netlist. The description of the DUT and the description of the debugging logic may be received in a same format or in different formats. Additionally, the input receiver 200 enables a user to provide information indicating which outputs of DUT logic components (i.e., signals) to trace during emulation using the debugging logic.

The synthesizer 210 converts HDL descriptions into gate level logic. If a description of the DUT and/or debugging logic is received in HDL, the synthesizer 210 synthesizes the HDL description to create a gate level netlist with a description of the DUT and/or debugging logic in terms of gate level logic. In one embodiment, the synthesizer 210 may also convert a received gate level netlist (e.g., for the DUT or the debugging logic) into another gate level netlist.

The logical mapping module 220 maps logic of the DUT and the debugging logic to components available in the FPGAs of the emulator 110. For the DUT and the debugging logic, the logical mapping module 220 identifies logic included in the gate level netlist that is not available in the emulator FPGAs and associates (assigns) a corresponding hardware component that is available in an emulator FPGA. For example, the logical mapping module 220 identifies a Boolean logic gate in the gate level netlist and associates the Boolean logic gate with a corresponding logic gate or a look up table (LUT) unit available in an FPGA. In one embodiment, the logical mapping module 220 modifies the gate level netlist based on the mapping.

The partitioning module 230 partitions the DUT and maps the partitions to emulator FPGAs. The partitioning module 230 partitions the DUT at the gate level into a number of partitions using the DUT's netlist. The partitioning module 230 maps each partition to one or more FPGAs of the emulator 110. The partitioning module 230 performs the partitioning and mapping using design rules, design constraints (e.g., timing or logic constraints), and information about the emulator 110.

The technology mapping module 240 maps physical components of the DUT based on the logical mapping and partitioning. Specifically, if necessary, the technology mapping module 240 modifies one or more partitions based on the partitions created and the mappings of the partitions to the FPGAs. For example, assume the DUT includes three logic gates where an output of a first logic gate is connected to an input of a second logic gate and an input of a third logic gate. The DUT may be partitioned such that the first logic gate and the second logic gate are to be implemented on the same FPGA, but the third logic gate is to be implemented on a different FPGA. A connection between the first logic gate and the third logic gate in different FPGAs may have an additional delay compared to a connection between two logic gates in the same FPGA, thereby causing incorrect operations. The technology mapping module 240 may add delay elements (or buffers) between the two logic gates on the same FPGA to match the delay between the logic gates on different FPGAs.

The placing and routing module 250 receives the gate level netlist and information about the partitioning and mapping, and determines placement and connections of each DUT logic component and debugging logic. The placing and routing module 250 places the logic components and the debugging logic in a manner that routings between the logic components and the debugging logic are optimized.

Figure 3:
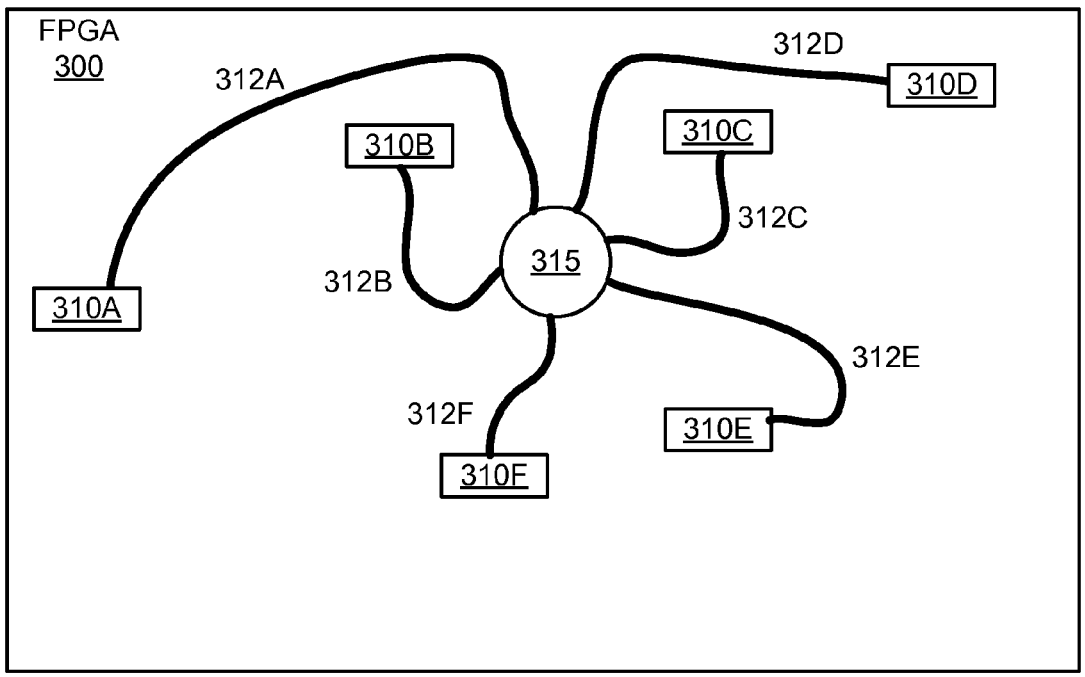
FIG. 3 is a layout diagram of an example FPGA including logic components routed to debugging logic in a conventional approach.

FIG. 3 illustrates an example layout diagram of an FPGA 300 according to a conventional approach. The FPGA 300 includes logic components 310A, 310B . . . 310F and debugging logic 315. Logic components 310A, 310B . . . 310F are routed to debugging logic 315 via routings 312A, 312B . . . 312F (herein may be also referred to as "routes 312") respectively. In a conventional approach, the debugging logic 315 is placed without consideration of the placement and routing of the logic components 310. As a result, the routings 312 between the logic components 310 and the debugging logic 315 are inefficient with long detours.

In one embodiment, the placing and routing module 250 places debugging logic after placing the logic components of the DUT but before routing the logic components. In this embodiment, the placing and routing module 250 prioritizes routings between the logic components and the debugging logic for enabling the connections between the logic components and the debugging logic to be short in distance. In this embodiment, for each emulator FPGA to which a partition has been mapped, the placing and routing module 250 determines the placement of the partition's logic components on the FPGA. If one or more outputs of the placed logic components are to be traced, the placing and routing module 250 places the debugging logic close to the logic components outputs that are to be traced (e.g., within a predetermined distance).

In one embodiment, to place the debugging logic close to the logic component outputs, the placing and routing module 250 places multiple debugging logic units on the FPGA. Each debugging logic unit may include the same or similar logic. In one embodiment, the placing and routing module 250 places a debugging logic unit on the FPGA in a location where a maximum number of the logic component outputs are within a predetermined distance of the unit. If there are additional logic component outputs that are not within a predetermined distance of the debugging logic unit, the placing and routing module 250 places an additional debugging logic unit on the FPGA in a location where a maximum number of the remaining logic component outputs will be within a predetermined distance of the additional unit. The process continues until each logic component output that is to be traced is within a predetermined distance of a debugging logic unit. Predetermined distances, predetermined lengths, and predetermined locations as described herein may be set by a system administrator or user.

The placing and routing module 250 selects for each logic component of the DUT whose one or more outputs are to be traced, a debugging logic unit with which to connect the component of the DUT. The placing and routing module 250 determines to connect the logic component with the closest placed debugging logic unit.

The placing and routing module 250 determines the routing between each logic component output and its respective debugging logic unit. Subsequently, the placing and routing module 250 determines the routing among the placed logic components taking into account the already determined routes between the debugging logic and the logic component outputs. Hence, the placing and routing module 250 places the debugging logic in a way that minimizes the length of the routes between the logic components and the debugging logic.

Figure 4:
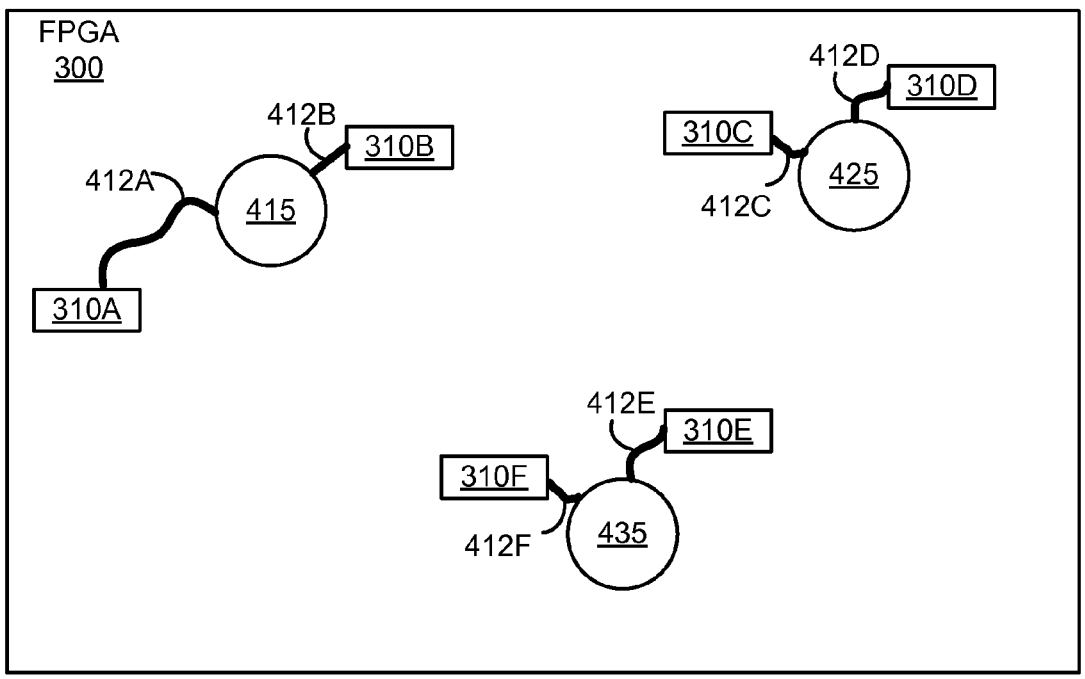
FIG. 4 is a layout diagram of an example FPGA including logic components routed to debugging logic, according to one embodiment.

As an example, FIG. 4 illustrates a layout diagram of an FPGA 300 with logic components 310A, 310B . . . 310F placed like in FIG. 3. However, in this example prior to the routing of the logic components 310A, 310B . . . 310F, the placing and routing module 250 places multiple debugging logic units 415, 425, and 435 in such a way that the length of the routes between the logic components 310A, 310B . . . 310F and the debugging logic is minimized. Debugging logic unit 415 is placed near logic components 310A and 310B and routed to logic components 310A and 310B via routings 412A and 412B respectively. Debugging logic unit 425 is placed near logic components 310C and 310D and routed to logic components 310C and 310D via routings 412C and 412D respectively. Debugging logic unit 435 is placed near logic components 310E and 310F and routed to logic components 310E and 310F via routings 412E and 412F respectively. As a result, the routes 412 in this example are much shorter than the routes 312 of FIG. 3.

In another embodiment, the placing and routing module 250 places the debugging logic after placing and routing logic components of the DUT. In this embodiment the placing and routing module 250 prioritizes routings between the logic components over routings to the debugging logic. For each emulator FPGA to which a partition has been mapped, the placing and routing module 250 places and routes the logic components of the partition. If one or more outputs of the placed logic components are to be traced, the placing and routing module 250 places the debugging logic close to the logic components outputs (e.g., within a predetermined distance) without interfering with the placed logic components and the routings among the logic components.

To place the debugging logic, the placing and routing module 250 places a debugging logic unit close to a logic component output where possible given the placement and routing of the logic components. The placing and routing module 250 attempts to route a connection between the debugging logic unit and the logic component output. If it is not possible to route the connection given the logic component routings or the length of the routing is more than a predetermined length, the placing and routing module 250 tries another location for the debugging logic unit. If the placing and routing module 250 is able to route the connection and the length of route is less than a predetermined length, the placing and routing module 250 maintains the placement of the unit. The placing and routing module 250 routes other logic component outputs to the debugging logic unit if the routes are less than the predetermined length. If one of the other logic component outputs cannot be routed to the placed debugging logic unit (e.g., the length of a route would be more than the predetermined length), the placing and routing module 250 places another debugging logic unit close to the other logic component output. The process is repeated until all of the logic component outputs that are to be traced are routed to one or more debugging logic units. Since the debugging logic is placed after the logic components are placed and routed, the placement of the debugging logic will not affect routings between the logic components.

In another embodiment, when a debugging logic unit is placed if it is not possible to route a connection between the unit and a nearby logic component because of one or more routed connections between logic components, the placing and routing module 250 unroutes the one or more connections. The placing and routing module 250 then determines new routings between the unrouted logic components to allow for the routing of a connection between the debugging logic unit and the nearby logic component.

In another embodiment, prior to placing logic components of a DUT, the placing and routing module 250 places throughout each FPGA a predetermined number of debugging logic units at predetermined locations. In one embodiment, debugging logic units are evenly/uniformly placed throughout the FPGA such that any logic components placed after can be guaranteed to be located within a predetermined distance from one of the debugging logic units.

For each FPGA, after placing the debugging logic units, the placing and routing module 250 places the logic components of the partition mapped to the FPGA. If one or more outputs of a placed logic components are to be traced, the placing and routing module 250 determines to connect the logic component with the nearest debugging logic unit. The placing and routing module 250 routes a connection between the logic component and the nearest debugging logic unit. The placing and routing module 250 also determines the routes between the logic components. In one embodiment, the placing and routing module 250 determines the routes from the logic component outputs that are to be traced to the debugging logic units prior to determining the routing of the connections between the logic components. In another embodiment, the placing and routing module 250 determines the routes between the logic components prior to determining the routes between the logic component outputs and the debugging logic units.

Figure 5:
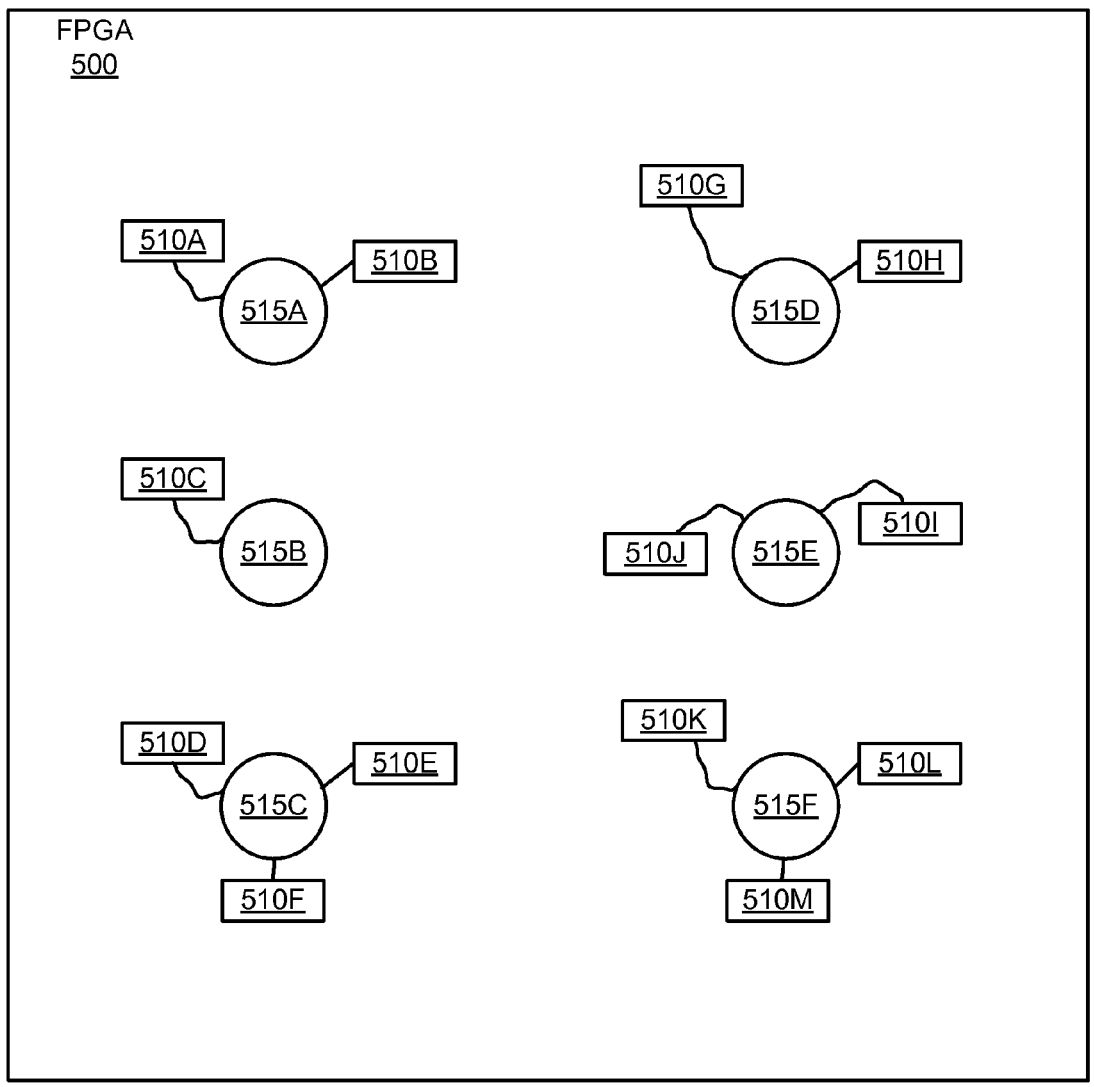
FIG. 5 is a layout diagram of an example FPGA including logic components routed to debugging logic, according to another embodiment.

FIG. 5 is an example layout diagram of an FPGA 500 to which a predetermined number of debugging logic units are placed. Prior to the placement of logic components 510A, 510B . . . 510M, the placing and routing module 250 places debugging logic units 515A, 515B . . . 515F on the FPGA 500 at predetermined locations. In this example, the debugging logic units 515 are evenly placed throughout the FPGA 500 in two columns and three rows.

After the debugging logic units 515 are placed, the placing and routing module 250 places the logic components 510. Subsequently, for each logic component 510, the closest placed debugging logic unit 515 is selected and a connection is routed between the logic component 510 and the selected debugging logic unit 515. For example, logic components 510A and 510B are routed to debugging logic unit 515A and logic components 510G and 510H are routed to debugging logic unit 515D. In this example it is assumed that an output of each logic component 510 is being traced. Since the debugging logic units 515 are placed throughout the FPGA 500, each logic component 510 is near a debugging logic unit 515 and as a result the connections between the logic components 510 and debugging logic units 515 are short in length.

Referring back to FIG. 2, the bit stream generation module 260 generates a bit stream describing information about configurations of the FPGAs of the emulator 110. The configurations of the FPGAs include placements of hardware components to be implemented, connections (i.e., routings) between components and other design information. The bit stream generation module 260 transmits the bits streams to the emulator 110 so that the FPGAs of the emulator 110 can be configured for emulating the DUT with the debugging logic. The bit stream may be stored in the storage 270 before, after or during transmission to the emulator 110.

Figure 6:
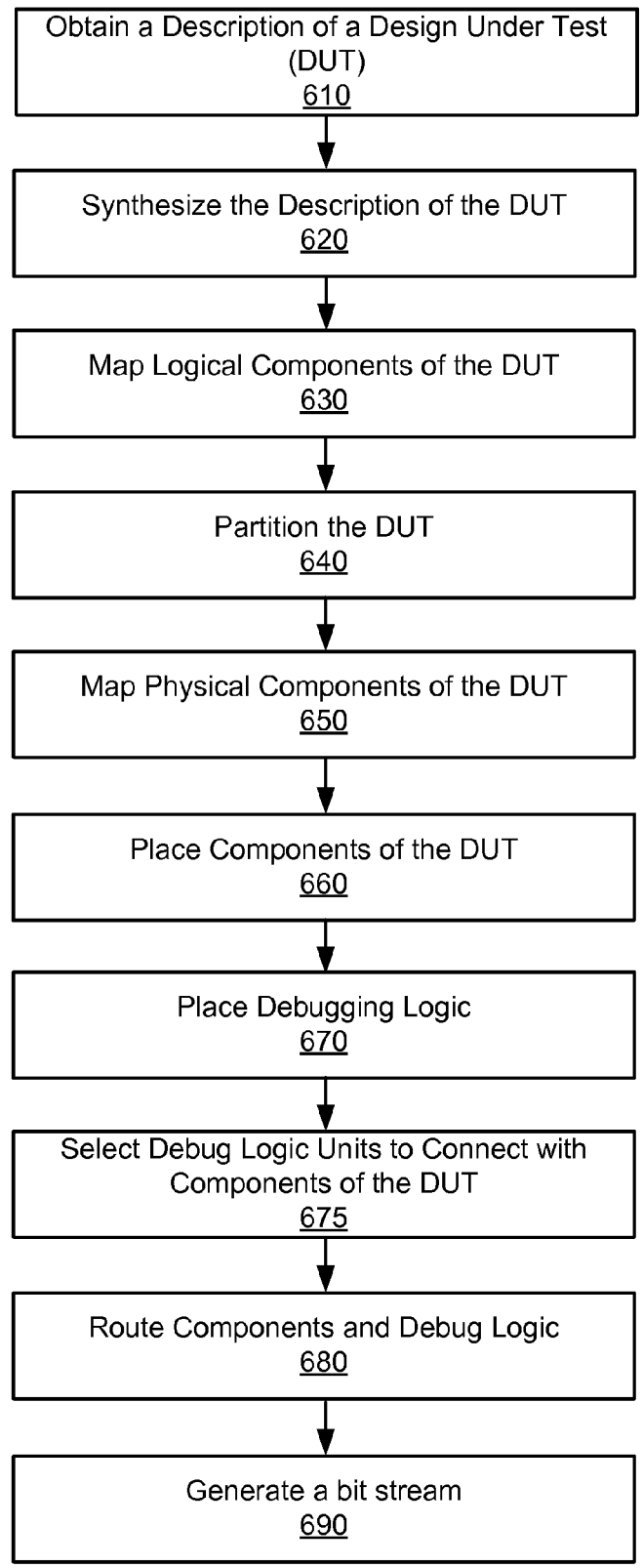
FIG. 6 is a flow chart illustrating the host system placing debugging logic after placing logic components of a DUT for emulation, according to one embodiment.

FIG. 6 is a flow chart illustrating the host system 120 compiling a DUT for emulation, where debugging logic is placed after the placement of DUT components. Other embodiments can perform the steps of FIG. 6 in different orders. Moreover, other embodiments can include different and/or additional steps than the ones described here.

The host system 120 obtains 610 from a user a description of a DUT in HDL. The host system 120 synthesizes 620 the HDL description of the DUT to create a gate level netlist. The host system 120 maps 630 logic components of the DUT to available components in one or more FPGAs of the emulator 110. The host system 120 partitions 640 the DUT at the gate level into a number of partitions. The host system 120 maps 650 physical components of the DUT according to the logical mapping and the partitioning.

The host system 120 places 660 logic components of the DUT on the FPGAs of the emulator 110. After the placement of the logic components, the host system 120 places 670 debugging logic on the FPGAs. For each logic component of the DUT that has at least one output that is to be traced, the host system 120 selects 675 a debugging logic unit with which to connect the logic component based on a distance between the logic component and the debugging logic unit. The host system 120 selects the nearest debugging logic unit. Then, the host system 120 routes 680 the logic components and the debugging logic. In one embodiment, the host system 120 determines the routing between components and their selected debugging logic units prior to the routing of connections between logic components. In another embodiment, the host system 120 determines the routing of connections between logic components prior to the routing of connections between logic components and their respective debugging logic units. The host system 120 places the debugging logic after the placement of the logic components to ensure that the debugging logic is placed near the logic components that are to be traced and for the routes between the debugging logic and the logic components to be short in length. The host system 120 generates 690 a bit stream describing information about configurations of one or more FPGAs of the emulator 110.

Figure 7:
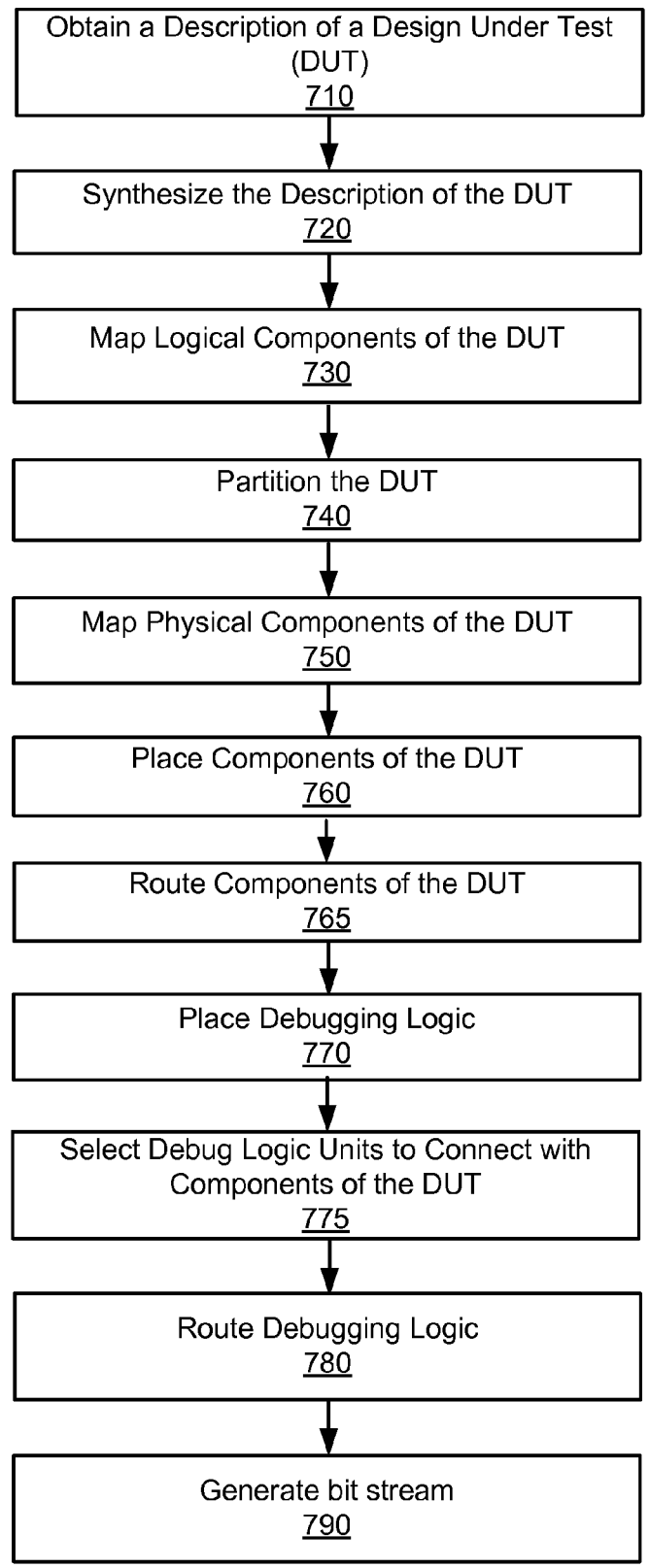
FIG. 7 is a flow chart illustrating the host system placing debugging logic after placing and routing logic components of a DUT for emulation, according to one embodiment.

FIG. 7 is a flow chart illustrating the host system 120 compiling a DUT for emulation, according to another embodiment. Other embodiments can perform the steps of FIG. 7 in different orders. Moreover, other embodiments can include different and/or additional steps than the ones described here.

In this embodiment, steps 710-760 are the same as steps 610-660 of FIG. 6. However, after the host system 120 places 760 logic components of the DUT, the host system 120 routes 765 the logic components of the DUT. After the logic components have been placed and routed, the host system 120 then places 770 the debugging logic.

For each logic component of the DUT that has at least one output that is to be traced, the host system 120 selects 775 a debugging logic unit with which to connect the logic component based on a distance between the logic component and the debugging logic unit. The host system 120 selects the nearest debugging logic unit. The host system 120 routes 780 the debugging logic to the logic components. The host system 120 generates 790 a bit stream describing information about configurations of one or more FPGAs of the emulator 110.

Figure 8:
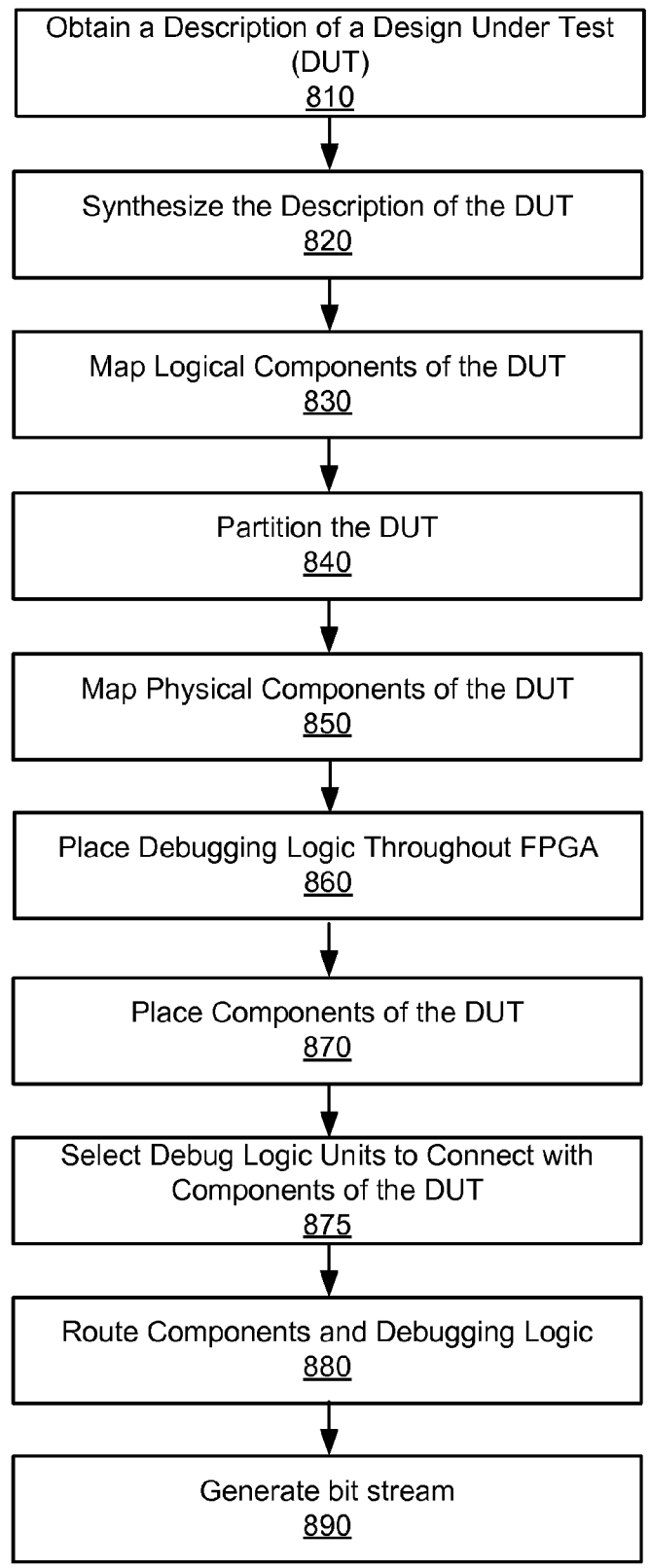
FIG. 8 is a flow chart illustrating the host system placing debugging logic evenly before placing logic components of the DUT for emulation, according to one embodiment.

FIG. 8 is a flow chart illustrating the host system 120 compiling a DUT for emulation, according to another embodiment. Other embodiments can perform the steps of FIG. 8 in different orders. Moreover, other embodiments can include different and/or additional steps than the ones described here.

In this embodiment, steps 810-850 are the same as steps 610-650 of FIG. 6. However, after the host system 120 maps 850 the physical components, for each emulator FPGA the host system 120 places 860 debugging logic throughout the FPGA. In one embodiment a predetermined number of debugging logic units are placed throughout the FPGA at predetermined locations. In one embodiment, the debugging logic units are evenly placed throughout the FPGA. In other embodiments, step 860 may occur prior to any of the steps of 810-850.

After the host system 120 places the debugging logic, the host system places 870 the logic components of the DUT. For each logic component of the DUT that has at least one output that is to be traced, the host system 120 selects 875 a debugging logic unit with which to connect the logic component based on a distance between the logic component and the debugging logic unit. The host system 120 routes 880 the logic components and the debugging logic. The host system 120 generates 890 a bit stream describing information about configurations of one or more FPGAs of the emulator 110.

Beneficially, debugging logic is placed approximate to an output of a logic component to be traced to enable efficient routing between the debugging logic and the output of the logic component. In one embodiment, the debugging logic is placed with knowledge of the placements of the logic components of a DUT after placing the logic components. In another embodiment, debugging logic is distributed evenly such that an output of a logic component is guaranteed to be near debugging logic. As a result, routings can be established between debugging logic and an output of a logic component without a long detour. Furthermore, an accuracy of tracing of outputs of logic components can be improved.

Computing Machine Architecture

Figure 9:
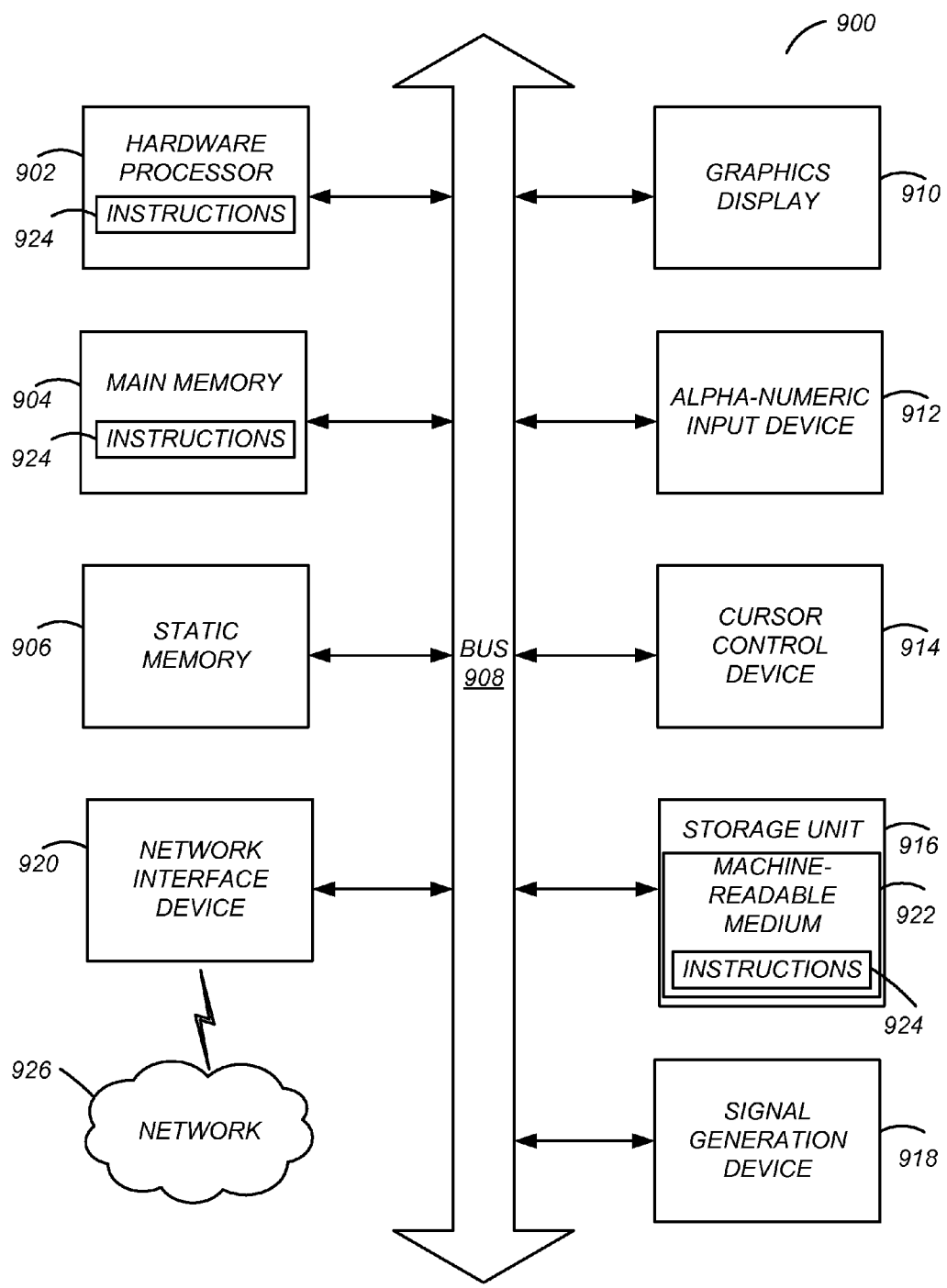
FIG. 9 illustrates one embodiment of components of an example machine able to read instructions from a machine-readable medium and execute them in a processor (or controller).

Turning now to FIG. 9, it is a block diagram illustrating components of an example machine able to read instructions from a machine-readable medium and execute them in a processor (or controller). Specifically, FIG. 9 shows a diagrammatic representation of a machine in the example form of a computer system 900 within which instructions 924 (e.g., software or program code) for causing the machine to perform (execute) any one or more of the methodologies described with FIGS. 1-8. The computer system 900 may be used for one or more of the entities (e.g., emulator 110, host system 120) illustrated in the emulation environment 100 of FIG. 1.

The example computer system 900 includes a hardware processor 902 (e.g., a central processing unit (CPU), a graphics processing unit (GPU), a digital signal processor (DSP), one or more application specific integrated circuits (ASICs), one or more radio-frequency integrated circuits (RFICs), or any combination of these), a main memory 904, and a static memory 906, which are configured to communicate with each other via a bus 908. The computer system 900 may further include graphics display unit 910 (e.g., a plasma display panel (PDP), a liquid crystal display (LCD), a projector, or a cathode ray tube (CRT)). The computer system 900 may also include alphanumeric input device 912 (e.g., a keyboard), a cursor control device 914 (e.g., a mouse, a trackball, a joystick, a motion sensor, or other pointing instrument), a storage unit 916, a signal generation device 918 (e.g., a speaker), and a network interface device 920, which also are configured to communicate via the bus 908.

The storage unit 916 includes a machine-readable medium 922 which stores instructions 924 (e.g., software) embodying any one or more of the methodologies or functions described herein. The instructions 924 (e.g., software) may also reside, completely or at least partially, within the main memory 904 or within the processor 902 (e.g., within a processor's cache memory) during execution thereof by the computer system 900, the main memory 904 and the processor 902 also constituting machine-readable media. The instructions 924 (e.g., software) may be transmitted or received over a network 926 via the network interface device 920.

While machine-readable medium 922 is shown in an example embodiment to be a single medium, the term "machine-readable medium" should be taken to include a single medium or multiple media (e.g., a centralized or distributed database, or associated caches and servers) able to store instructions (e.g., instructions 924). The term "machine-readable medium" shall also be taken to include any medium that is capable of storing instructions (e.g., instructions 924) for execution by the machine and that cause the machine to perform any one or more of the methodologies disclosed herein. The term "machine-readable medium" includes, but not be limited to, data repositories in the form of solid-state memories, optical media, and magnetic media.

As is known in the art, a computer system 900 can have different and/or other components than those shown in FIG. 9. In addition, the computer system 900 can lack certain illustrated components. For example, a computer system 900 acting as the emulator 110 may include one or more hardware processors 902, multiple storage units 916, a network interface device 920, and multiple configurable logic circuits (as described above with reference to FIG. 1), among other components, but may lack an alphanumeric input device 912 and a cursor control device 914. For another example, a computer system 900 acting as a host system 120 may include one or more hardware processors 902. The host system 120 with multiple processors 902 may perform multiple simulations in parallel on multiple threads, processes and/or machines.

Additional Configuration Considerations

It is noted that although the subject matter is described in the context of emulation environment for emulation of digital circuits and systems, the principles described may be applied to analysis of any digital electronic devices. Advantages of the disclosed configurations include placing and routing debugging logic near outputs of logic components to achieve accurate tracing of the outputs of logic component. Moreover, while the examples herein are in the context of an emulation environment, the principles described herein can apply to other analysis of hardware implementations of digital circuitries including FPGA and ASIC, FPGA or ASIC-based prototypes (in either hardware or software), or software simulation such as EDA tools. In one embodiment, the ASIC includes one or more debugging logic units, and one or more debugging logic units can be selected instead of determining placement of the debugging logic units in the FPGA.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms, for example, as illustrated in FIGS. 1-8. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software (or computer program code)) may be driven by cost and time considerations.

The various operations of example methods described herein may be performed, at least partially, by one or more processors, e.g., processor 902, that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for a system and a process for efficient placement and routing of debugging logic through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A non-transitory computer readable medium storing instructions, the instructions when executed by one or more processors cause the one or more processors to:
   determine placement of a plurality of logic components included in a design under test (DUT) on an emulation hardware component included in an emulator;
   select a debugging logic unit with which to connect a logic component from the plurality of logic components based on a distance between the placement of the logic component and the debugging logic unit on the emulation hardware component; and
   transmit, to the emulator, a file describing the placement of the logic component from the plurality of logic components and a connection between the selected debugging logic unit and the logic component from the plurality of logic components,
   wherein the emulation hardware component is configured based on the file.

2. The non-transitory computer readable medium of claim 1, wherein the emulation hardware component is a field programmable gate array (FPGA).

3. The non-transitory computer readable medium of claim 1, wherein the instructions when executed by the one or more processors further cause the one or more processors to:
   select a secondary debugging logic unit with which to connect an additional logic component from the plurality of logic components based on a distance between the placement of the additional logic component and the secondary debugging logic unit.

4. The non-transitory computer readable medium of claim 1, wherein the instructions when executed by the one or more processors further cause the one or more processors to:
   determine placement of the debugging logic unit on the emulation hardware component in response to the placement of the plurality of logic components.

5. The non-transitory computer readable medium of claim 4, wherein the instructions when executed by the one or more processors that cause the one or more processors to determine the placement of the debugging logic unit further comprise instructions that cause the one or more processors to:
   compare distances between the logic component and candidate locations for the debugging logic unit; and
   determine to place the debugging logic unit at a candidate location with a shortest distance from the logic component.

6. The non-transitory computer readable medium of claim 4, wherein the instructions when executed by the one or more processors that cause the one or more processors to determine the placement of the debugging logic unit further comprise instructions that cause the one or more processors to:
   determine to place the debugging logic unit at a first location within a predetermined distance of the logic component from the plurality of logic components;
   determine routing of the connection between the debugging logic unit and the logic component; and
   determine to place the debugging logic unit at a second location in response to a distance of the connection being greater than a predetermined length.

7. The non-transitory computer readable medium of claim 1, wherein the instructions when executed by the one or more processors further cause the one or more processors to:
   determine routing of the connection between the debugging logic unit and the logic component from the plurality of logic components; and responsive to determining routing of the connection, determine routing of connections between the plurality of logic components.

8. The non-transitory computer readable medium of claim 1, wherein the instructions when executed by the one or more processors further cause the one or more processors to:
determine routing of connections between the plurality of logic components; and
responsive to determining the routing of the connections, determine routing of the connection between the debugging logic unit and the logic component from the plurality of logic components.

9. The non-transitory computer readable medium of claim 1, wherein the debugging logic unit is selected based on distances between placement of the debugging logic unit, an additional debugging logic unit, the logic component, and an additional logic component from the plurality of logic components on the emulation hardware component.

10. The non-transitory computer readable medium of claim 1, wherein the instructions when executed by the one or more processors further cause the one or more processors to:
determine routing of the connection between the logic component from the plurality of logic components and the debugging logic unit in response to determining placement of the debugging logic unit on the emulation hardware component.

11. The non-transitory computer readable medium of claim 1, wherein the instructions when executed by the one or more processors that cause the one or more processors to select the debugging logic unit further comprise instructions that cause the one or more processors to:
select the debugging logic unit based on the debugging logic unit being within a predetermined distance of the logic component;
determine routing of the connection between the debugging logic unit and the logic component;
determine to maintain placement of the debugging logic unit in response to a length of the connection between the debugging logic unit and the logic component being less than a predetermined length;
determine routing of a connection between the debugging logic unit and another logic component from the plurality of logic components; and
select another debugging logic unit placed on the emulation hardware component in response to a length of the connection between the debugging logic unit and said another logic component being greater than a predetermined length.

12. The non-transitory computer readable medium of claim 1, wherein the instructions when executed by the one or more processors further cause the one or more processors to:
determine placement of a plurality of debugging logic units on the emulation hardware component,
wherein the placement of the plurality of logic components is determined in response to the placement of the plurality of debugging logic units.

13. The non-transitory computer readable medium of claim 12, wherein the plurality of debugging logic units are evenly placed throughout the emulation hardware component or throughout a region of the emulation hardware component.

14. The non-transitory computer readable medium of claim 12, wherein the plurality of debugging logic units are placed without considering the plurality of logic components that are to be placed on the emulation hardware component.

15. The non-transitory computer readable medium of claim 12, wherein the instructions when executed by the one or more processors further cause the one or more processors to:
responsive to determining the placement of the plurality of logic components and selecting the debugging logic unit:
determine routing of the connection between the logic component and the debugging logic unit; and
determine routing of connections between the plurality of logic components.

16. The non-transitory computer readable medium of claim 1, wherein the instructions when executed by the one or more processors further cause the one or more processors to:
determine routing of a connection between two of the plurality of logic components;
responsive to determining no feasible routing of the connection between the debugging logic unit and the logic component, unroute the connection between the two of the plurality of logic components; and
determine routing of the connection between the two of the plurality of logic components and the connection between the debugging logic unit and the logic component.

17. A method comprising:
determining placement of a plurality of logic components included in a design under test (DUT) on an emulation hardware component included in an emulator;
selecting a debugging logic unit with which to connect a logic component from the plurality of the logic components based on a distance between the placement of the logic component and the debugging logic unit on the emulation hardware component; and
transmitting, to the emulator, a file describing the placement of the logic component from the plurality of logic components and a connection between the selected debugging logic unit and the logic component from the plurality of logic components,
wherein the emulation hardware component is configured based on the file.

18. The method of claim 17, further comprising:
determining placement of the debugging logic unit on the emulation hardware component in response to the placement of the plurality of logic components.

19. The method of claim 17, further comprising:
determining placement of a plurality of debugging logic units on the emulation hardware component,
wherein the placement of the plurality of logic components is determined in response to the placement of the plurality of debugging logic units.

* * * * *